(12) United States Patent
Verma et al.

(10) Patent No.: US 7,800,404 B2
(45) Date of Patent: Sep. 21, 2010

(54) FIELD PROGRAMMABLE APPLICATION SPECIFIC INTEGRATED CIRCUIT WITH PROGRAMMABLE LOGIC ARRAY AND METHOD OF DESIGNING AND PROGRAMMING THE PROGRAMMABLE LOGIC ARRAY

(75) Inventors: Hare K Verma, Bangalore (IN); Manoj Gunwani, Vallejo, CA (US); Conrad Kong, San Jose, CA (US); Jai Liu, San Ramon, CA (US); Nilanjan Chatterjee, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/315,653

(22) Filed: Dec. 5, 2008

(65) Prior Publication Data

US 2009/0160483 A1   Jun. 25, 2009

Related U.S. Application Data

(60) Provisional application No. 61/005,616, filed on Dec. 5, 2007.

(51) Int. Cl.
*H01L 25/00* (2006.01)
(52) U.S. Cl. .......................................... 326/41; 326/47
(58) Field of Classification Search ............. 326/38–41, 326/46, 47
See application file for complete search history.

(56) References Cited

U.S. PATENT DOCUMENTS 6,211,697 B1 * 4/2001 Lien et al. ..................... 326/41

* cited by examiner

*Primary Examiner*—Daniel D Chang
(74) *Attorney, Agent, or Firm*—Hayes and Boone LLP (57) ABSTRACT

A programmable logic array for use in a field programmable application specific integrated circuit (ASIC) implementation is provided. The programmable logic array includes programmable logic blocks, and programmable logic interfaces. The programmable logic interfaces couple the programmable logic blocks to external interfaces of the field programmable ASIC, and enable the programmable logic array to be inserted into the field programmable ASIC as a hard macro block.

17 Claims, 12 Drawing Sheets

FIELD PROGRAMMABLE APPLICATION SPECIFIC INTEGRATED CIRCUIT WITH PROGRAMMABLE LOGIC ARRAY AND METHOD OF DESIGNING AND PROGRAMMING THE PROGRAMMABLE LOGIC ARRAY

RELATED APPLICATION

This application claims the benefit of priority to U.S. Provisional Patent Application No. 61/005,616, filed on Dec. 5, 2007, which is hereby incorporated by reference in its entirety.

TECHNICAL FIELD

The present invention is related to a programmable logic array, and a method for designing and programming a programmable logic array. In particular, the present invention is directed to a field programmable logic array that can be inserted within an application specific integrated circuit (ASIC) or application specific standard product (ASSP) implementation as a hard macro block.

DISCUSSION OF RELATED ART

Application specific standard products (ASSP)s including application specific integrated circuits (ASIC)s are customized for a particular use which may offer high performance and low cost. However, ASSPs and ASICs provide little flexibility. ASICs are typically designed using design tools available from the ASIC manufacturer. The ASIC designer typically constructs a description of the desired ASIC using a hardware descriptor language (HDL), in a process known as register transfer level (RTL) design. Common HDLs include Verilog HDL and VHDL. The HDL includes logical primitives which represent descriptions of particular circuits or operations. The primitives may also be known as intellectual property (IP) cores, which are designs purchased from a third party. Primitives provided as a HDL description for use in design are known as soft macros, and primitives provided as a fully routed design that can be printed directly onto an ASIC mask are known as hard macros.

Verification is then typically performed on the ASIC design to ensure that it achieves its intended purpose. Such verification techniques may include logic simulation, formal verification, and emulation. The RTL design is then transformed into a large collection of cells which are typically specific to the ASIC manufacturer, based on the cell libraries, and correspond to collections of gates. The collection of cells is typically referred to as a netlist. The netlist is then processed by a placement tool, which places the cells onto a region representing the designed ASIC in a process known as placing. A routing tool then takes the physical placement of the cells and uses the netlist to create the electrical connections between the cells, a process known as routing. Based on the final layout of the cells, additional testing may then be performed.

As noted above, due to the customized nature of the circuit, ASICs may provide a high performance silicon solution offering high performance at a low cost. However, once the ASIC has been manufactured, a designer or integrator cannot change the operation of the ASIC. On the other hand, a field-programmable logic gate array, or just field-programmable logic array or programmable logic array, is a semiconductor device which may be programmed and configured by an end-user or integrator after manufacturing. Programmable logic arrays are typically designed and manufactured using electronic design automation tools and procedures which are similar to those used to design and manufacture ASICs, as is discussed above. Programmable logic arrays typically contain programmable logic blocks, reconfigurable interconnects for connecting the logic blocks, and memory elements. Programmable logic arrays, while offering excellent flexibility, often exhibit decreased performance and higher costs when compared to ASICs.

There is therefore a need for a silicon solution which utilizes the flexibility of a programmable logic array in an application specific product or integrated circuit.

SUMMARY

In accordance with aspects of the present invention, there is provided a programmable logic array for use in a field programmable application specific integrated circuit (ASIC). The programmable logic array comprises programmable logic blocks, and programmable logic interfaces. The programmable logic interfaces couple the programmable logic blocks to external interfaces of the field programmable ASIC, and enable the programmable logic array to be inserted into the field programmable ASIC as a hard macro block.

In accordance with aspects of the present invention, there is also provided a computer-readable medium containing computer-executable instructions for performing a method for designing a programmable logic array and implementing the logic array in an application specific integrated circuit (ASIC) to produce a field programmable ASIC. The method comprises designing the programmable logic array using a plurality of programmable logic block cells and programmable logic interface cells, mapping the designed programmable logic array onto a blank programmable logic device, placing the mapped designed programmable logic array onto the blank programmable logic device, routing the placed designed programmable logic array on the blank programmable logic device, configuring the programmable logic device to operate as designed and to be inserted into the ASIC as a hard macro block.

These and other embodiments will be described in further detail below with respect to the following figures.

In the drawings, elements having the same designation have the same or similar functions.

DETAILED DESCRIPTION

In the following description specific details are set forth describing certain embodiments of the invention. It will be apparent, however, to one skilled in the art that the present invention may be practiced without some or all of these specific details. The specific embodiments presented are meant to be illustrative of the present invention, but not limiting. One skilled in the art may realize other material that, although not specifically described herein, is within the scope and spirit of this disclosure.

Figure 1:
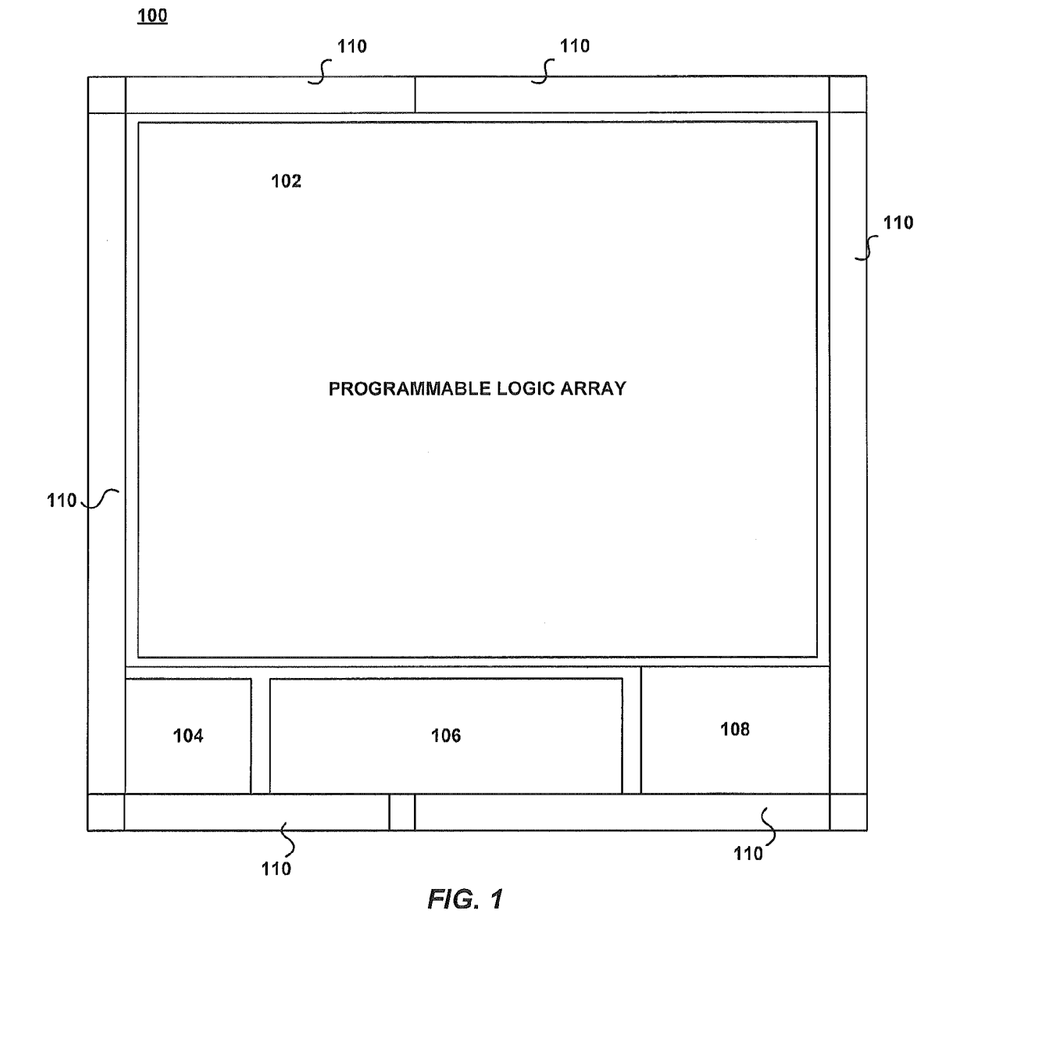
FIG. 1 is a diagram showing a field programmable ASIC, consistent with the present invention.

FIG. 1 is a diagram showing a field programmable ASIC 100, consistent with the present invention. As shown in FIG. 1, field programmable ASIC 100 includes a field programmable logic array 102, also referred to as programmable logic array 102. In accordance with some embodiments of the present invention, field programmable logic array 102 may be configured to be integrated into field programmable ASIC 100 to create a programmable ASIC or ASSP. In accordance with some embodiments of the present invention, programmable logic array 102 can be implemented in methods which are similar to IP blocks such as memory, and other hard macro blocks, allowing for integration within the field programmable ASIC 100.

Figure 2:
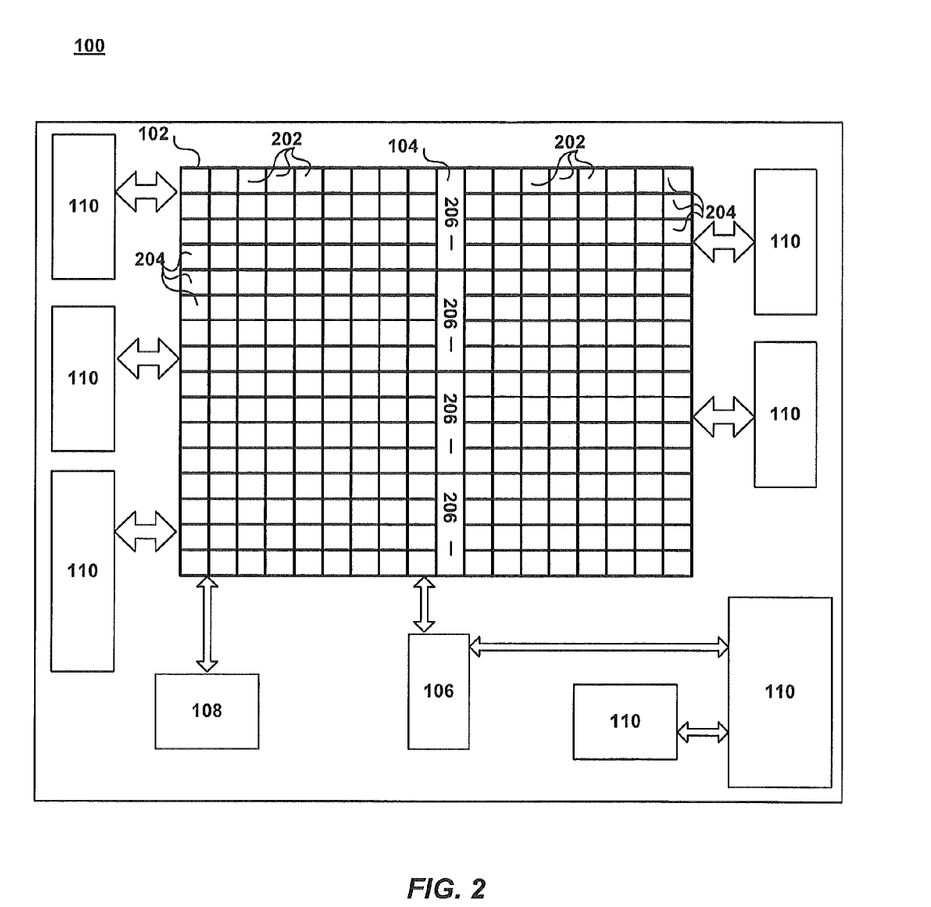
FIG. 2 is a diagram showing a top level block diagram of a field programmable ASIC, consistent with the present invention.

As shown in FIG. 1, field programmable ASIC 100 may also include an embedded IP block 104, which is shown in FIG. 1 as being logically coupled to programmable logic array, but, as shown in FIG. 2, may also be embedded within programmable logic array 102. In accordance with some embodiments of the present invention, embedded IP block 104 may include a static random access memory (SRAM)-based configuration memory interface, having an address input bus, a data bidirectional bus, a clock, and appropriate enable signals. The configuration memory interface may operate at a frequency of at least 10 MHz, which may yield a bandwidth of 160 Mbps when operating on a 16 bit data bus and a write or read time of about 20 milliseconds. The configuration memory interface may also allow for simultaneous read and write configurations for the use of built-in self test (BIST) configurations.

Field programmable ASIC 100 may also include clock management block 106 and memory block 108. In accordance with some embodiments of the present invention, clock management block 106 may provide phase-locked loop and multiplexed clock signals to field programmable ASIC 100. Field programmable ASIC 100 may also include a plurality of input/output blocks 110. Input/output blocks 110, may facilitate the input and output of signals throughout field programmable ASIC 100.

FIG. 2 is a diagram showing a top level block diagram of field programmable ASIC 100. As shown in FIG. 2, programmable logic array 102 includes a plurality of programmable logic blocks 202 and a plurality of programmable logic interface blocks 204. In accordance with some embodiments of the present invention, programmable logic blocks 202 and programmable logic interface blocks may be tiled by abutment, as is shown in FIG. 2. In accordance with some embodiments of the present invention, and as shown in FIG. 2, programmable logic interface blocks 204 may include all blocks in programmable logic array 102 in the left-most and right-most columns of array 102, and programmable logic blocks 202 include the remaining blocks in array 102. As also shown in FIG. 2, embedded EP block 104 is logically part of programmable logic array 102, and, in accordance with some embodiments of the present invention, includes a plurality of SRAM banks 206.

Figure 3A:
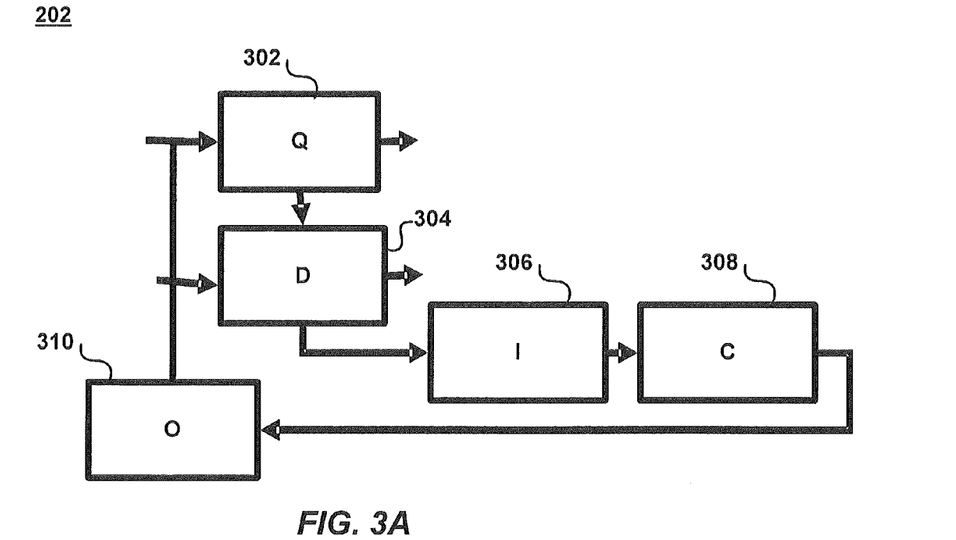
FIG. 3A is a flow diagram showing a conceptual flow of signals throughout a programmable logic block, consistent with the present invention.
Figure 3B:
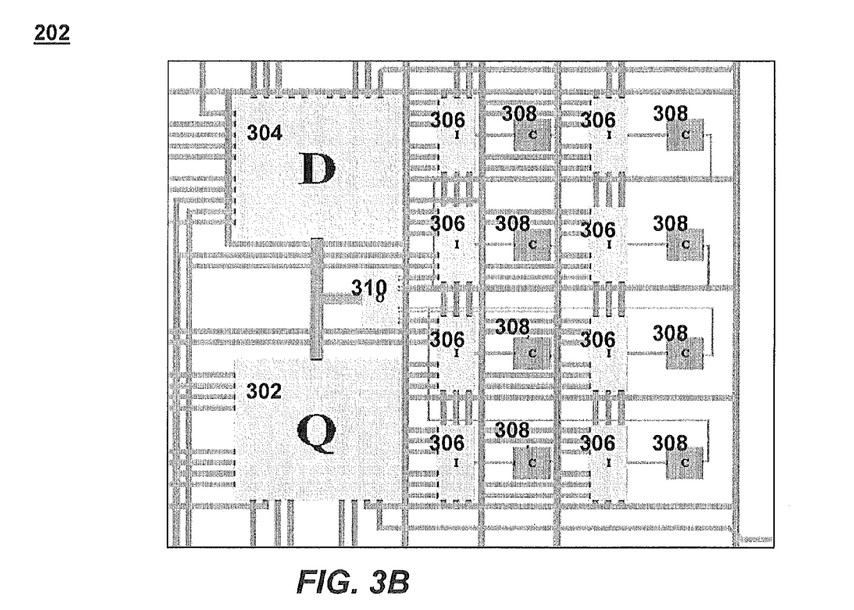
FIG. 3B is a conceptual diagram illustrating a programmable logic block as laid out on a circuit, consistent with the present invention.

FIGS. 3A and 3B are diagrams showing programmable logic block 202, consistent with the present invention. In particular, FIG. 3A is a flow diagram showing a conceptual flow of signals throughout programmable logic block 202, and FIG. 3B is a conceptual diagram illustrating programmable logic block 202 as laid out on a circuit. As is shown in both FIGS. 3A and 3B, programmable logic block 202 includes a plurality of cells or primitives. The cells or primitives may be either programmable logic routing cells or programmable logic cells. The specific routing cells and logic cells may be referred to in design as primitives, and such terminology may be used interchangeably herein. Consistent with the present invention, logic cells (C) or primitives may implement look-up-table functionality to implement arithmetic, multiplexer and register functionality. The routing cells or primitives may provide input multiplexing, output multiplexing and line crossovers. In particular, the routing cells may include double (D), quad (Q), output (O), and input (I) multiplexer cells, the double and quad cells providing coupling over two logic cells (double) and four logic cells (quad).

As shown in FIG. 3A, signals from four signal lines, or quad lines, is input into quad multiplexer cell 302, and signals from two signal lines, or double lines, is input into double multiplexer cell 304. The signals input into quad 302 and double 304 multiplexer cells are input into input multiplexer cell 306, which multiplexes the signals and inputs the signal into logic cell 308. After logic cell 308 performs logic operations on the signal, an output signal is presented to output multiplexer primitive 310, which may then output a signal that may further be output through quad 302 and double 304 multiplexer cells to be output over the quad and double lines.

FIG. 3B is a diagram showing an example of a programmable logic block 202 circuit, consistent with the present invention. As shown in FIG. 3B, programmable logic block 202 may have a plurality of input multiplexer cells 306, and a plurality of logic cells 308.

Figure 4:
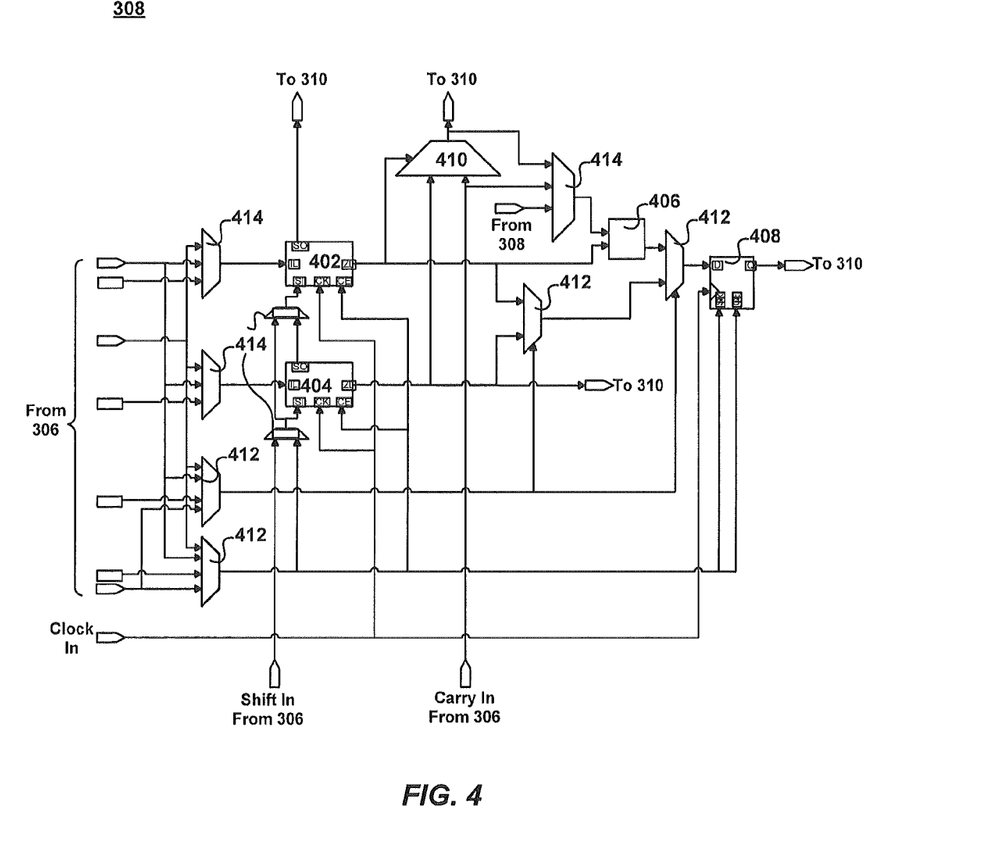
FIG. 4 is a diagram showing a logical view of a logic cell, consistent with the present invention.

In accordance with some embodiments of the present invention, logic cell 308 may include look-up tables, for example a four-input look-up table. FIG. 4 is a diagram showing a logical view of logic cell 308, consistent with the present invention. Each logic cell 308 which includes a 4 input look-up table may include two instances of a four input look-up table, one of which is a propagate look-up table 402, and the other of which is a generate look-up table 404. As shown in FIG. 4, propagate look-up table and generate look-up table each may include a plurality of inputs, including a shift-in input SI, a clock input CK, a look-up table multiplexer input IL, a horizontal multiplexer input CE, and a shift output SO and a look-up table output ZL. The combination of propagate look-up table 402 and generate look-up table 404 effectively creates a five (5)-input look-up table. This may further enable the creation of six, seven, and eight-input look-up tables and logic functions through the combination of two logic cells 308. In accordance with some embodiments of the present invention, propagate look-up table 402 can also be used as an 8-bit left shift register and then can be combined with generate look-up table 404 to create a 16-bit left shift register.

Logic cell 308 may further include, for example, a two-input look-up table 406, consistent with the present invention. Logic cell 308 including two-input look-up table 406 may be used to implement summing functionality. Logic cell 308, using two-input look-up table 406, may be further used to implement a six-input look-up table, as well as seven and eight-input logic functions.

Logic cell 308 may further include a configurable flip-flop 408, consistent with the present invention. Logic cell 308 including configurable flip-flop 408 may include set/reset, enable, and latch functionalities. In particular, configurable flip-flop 408 may be set to act as a latch or masterslave, and be set to be sensitive to a positive edge or a negative edge of a clock signal.

In accordance with some embodiments of the present invention, logic cell 308 may further include a vertical multiplexer 410, which is a multiplexer in a vertical direction of array 100 and can support functionalities including carry look ahead, multiplexing, arithmetic, reduction and encoding. Logic cell 308 may further include horizontal multiplexers 412, which are multiplexers in the horizontal direction of array 100 which can be used to construct diverse functionalities, including five and six input look-up tables, and seven and eight input multiplexers. Logic cell 308 may also include a plurality of additional multiplexers 414 for simply multiplexing input signals into look-up tables 402, 404, and 406 and configurable flip-flop 408.

Based on the structures which may be included in logic cell 308, a single logic cell 308 may have the functionality of two, four-input look-up tables with common inputs. Two logic cells 308 may be combined to create two, five-input look-up tables with common inputs. Two logic cells 308 may also be combined to create a single six-input look-up table. Two logic cells 308 may further be combined to implement eight-input logic functions. One or more logic cells 308 may be combined to implement adder/subtractor functionality using vertical multiplexer 410 and two-input look-up table 406. One or more logic cells 308 may also be combined to implement multiplexing functionality also using vertical multiplexer 410 and two-input look-up table 406. Shift register functionality may be implemented using one or more logic cells 308, up to a 16-bit left shift register in a single logic cell 308, and multiple logic cells 308 may be chained together to obtain larger shift registers. One or more logic cells 308 may further be combined to implement gate functionality using multiple two-input look-up tables 406.

Returning to FIGS. 3A and 3B, in accordance with some embodiments of the present invention, double multiplexing cell 304 may select a double driver from incoming line structure to drive a signal over the length of two programmable logic blocks 202. Quad multiplexing cell 302 may select a quad driver from incoming line structure to drive a signal over the length of four programmable logic blocks 202. Input multiplexers 306 may select a signal to be input into logic cells 308. Output multiplexing cell 310 may select an output signal from logic cell 308 to be driven by quad multiplexing cell 302 or double multiplexing cell 304.

Figure 5A:
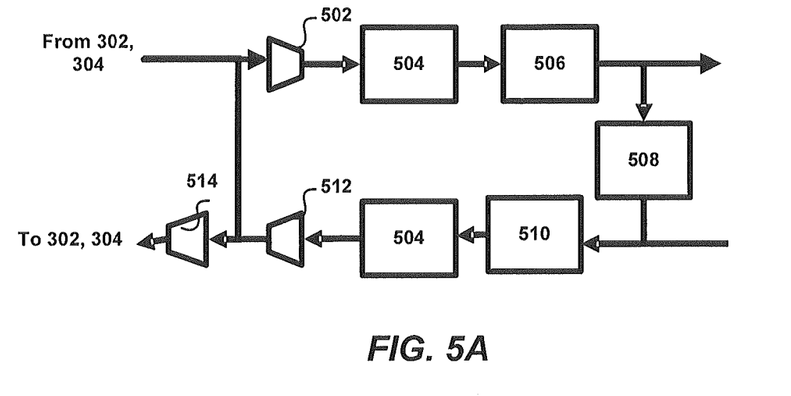
FIG. 5A is a logical flow diagram illustrating how signals flow through a programmable logic interface, consistent with the present invention.
Figure 5B:
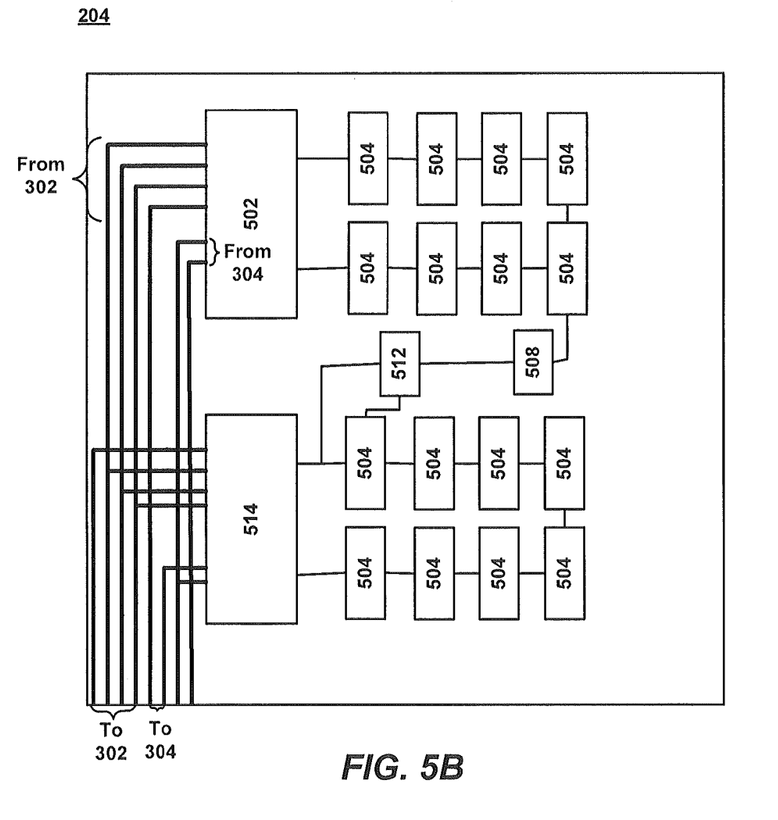
FIG. 5B is an example of a programmable logic interface as it may be laid out on a chip, consistent with the present invention.

FIGS. 5A and 5B are diagrams showing programmable logic interface 304, consistent with the present invention. In particular, FIG. 5A is a logical flow diagram illustrating how signals flow through programmable logic interface 304, and FIG. 5B is an example of programmable logic interface 304 as it may be laid out on a chip. As shown in FIG. 5A, programmable logic interface 304 may include double/quad multiplexing cell 502, which is coupled to logic block input cell 504. Logic block input cell 302 is coupled to output buffer cell 506, which outputs signals from programmable logic interface 304, and also provides an input signal to bidirectional connection cell 508. Signals from bidirectional connection cell 508 and signals input into programmable logic interface 304 are then input into an input buffer cell 510. Input buffer cell 510 outputs a signal which is input into another logic block input cell 504, and then sent to double/quad driving multiplexer cell 512. The signal output from double/quad multiplexer cell 512 is input into wraparound multiplexer cell 514, and sampled and input into double/quad multiplexing cell 502. The signal output from wraparound multiplexer cell 514 is transmitted over double lines and quad lines to double multiplexer cell 304 and quad multiplexer cell 304 of programmable logic block 202. As shown in FIG. 5B, programmable logic interface 204 may include a plurality of logic block input cells 504.

In accordance with some embodiments of the present invention, double/quad multiplexing cell 502 may act as a multiplexing cell to select from double multiplexing cell 304 and quad multiplexing cell 302 of programmable logic block 202. Double/quad driving cell 512 may act as a multiplexer to providing a driving signal from an input pad of programmable logic interface 204 to double multiplexing cell 304 and quad multiplexing cell 304 of programmable logic block 202. Wraparound multiplexer cell 514 may act as a multiplexer cell to allow lines from double multiplexing cell 304 and quad multiplexing cell 302 of programmable logic block 202 to wrap around, or exit array 102 and reenter array 102 at a different point. Bidirectional connection cell 508 may combine an input pad and an output pad to make a bidirectional pad, as shown in FIGS. 5A and 5B. Input buffer cell 510 may act as an input buffer for programmable logic interface 204.

Figure 6:
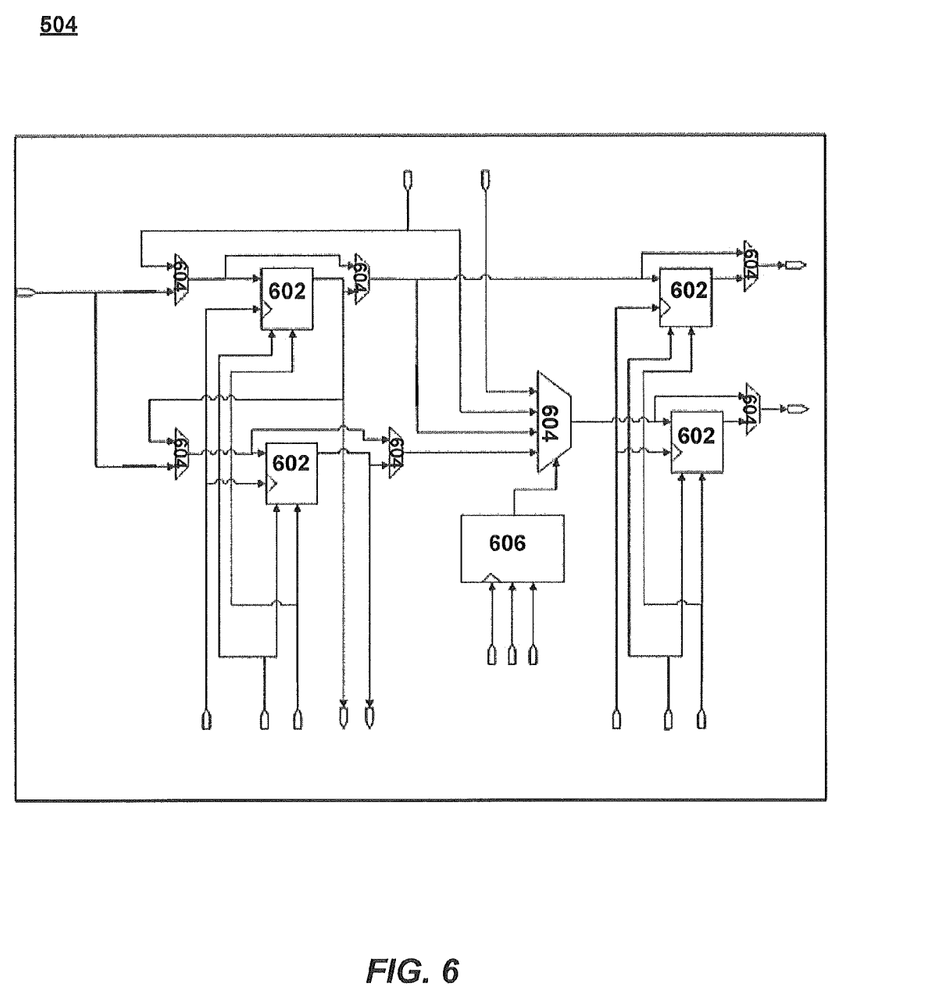
FIG. 6 shows a logical view of a logic block input cell, consistent with the present invention.

FIG. 6 shows a logical view of logic block input cell 504, consistent with the present invention. As shown in FIG. 6, logic block input cell 504 includes a plurality of flip-flops 602, a plurality of multiplexers 604, and a configurable counter 606. Flip-flops 602 provide the ability to register data input and output from logic block input cell 504. Flip-flops 602 in combination with configurable counter 606 may allow for the serialization or de-serialization of inputs and outputs to allow programmable logic array 102 and the remainder of field programmable ASIC 100 to use separate clocks. Furthermore, logic block input cells 504 may also synchronize data input to and output from programmable logic array 102. Logic block cells 504 may also incorporate extra logic to implement boundary scan testing capability, for performing boundary scan testing on field programmable ASIC 100.

Figure 7A:
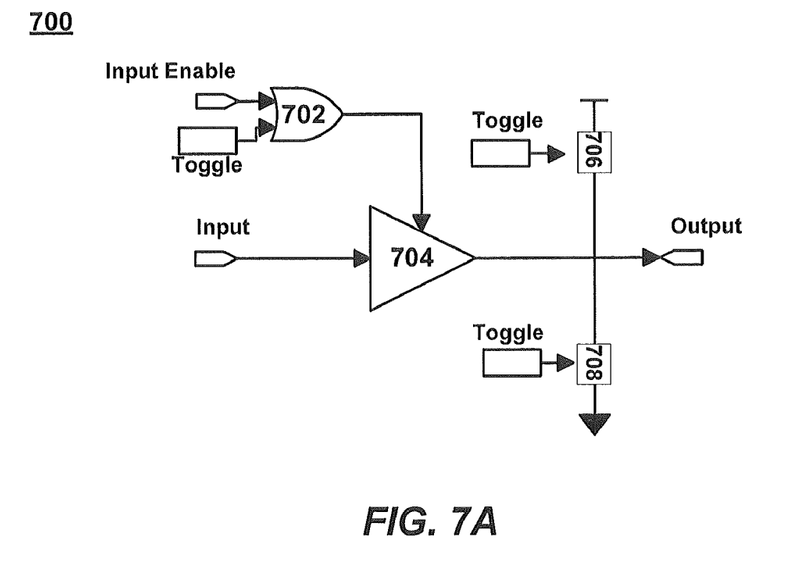
FIG. 7A shows a logical view of an output buffer cell, consistent with the present invention.
Figure 7B:
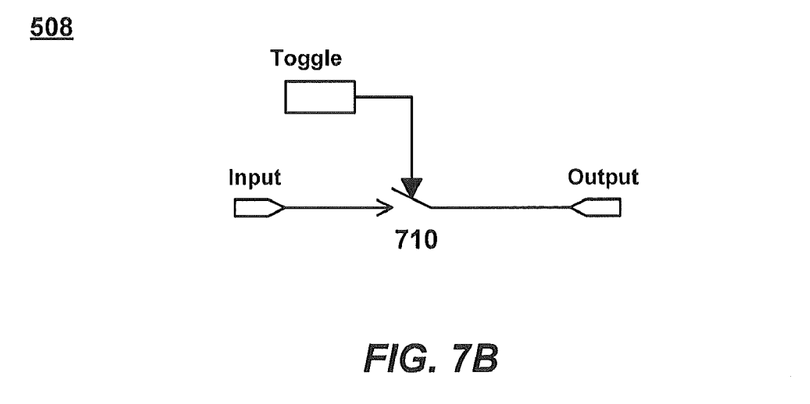
FIG. 7B shows a logical view of a bidirectional connection cell, consistent with the present invention.
Figure 7C:
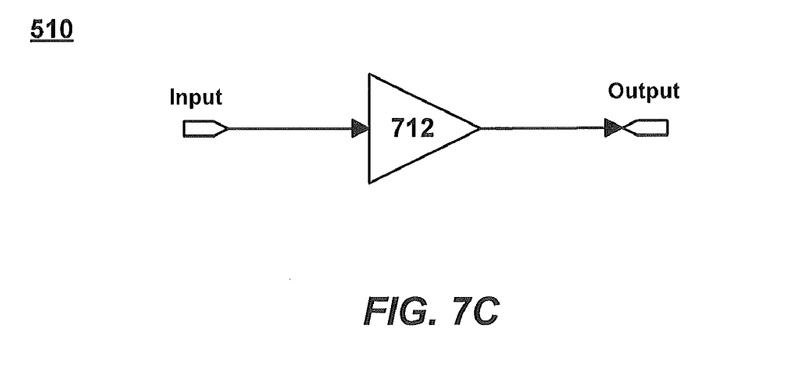
FIG. 7C shows a logical view of an input buffer cell, consistent with the present invention.

FIGS. 7A, 7B, and 7C show logical views of other programmable logic interface 204 cells. In particular, FIG. 7A shows a logical view of output buffer cell 700, FIG. 7B shows a logical view of bidirectional connection cell 508, and FIG. 7C shows a logical view of input buffer cell. As shown in FIG. 7A, output buffer cell 700 includes an OR circuit 702 coupled to a buffer 704. An input enable signal and a toggle signal is input into OR circuit 702, and when OR circuit is toggled by toggle signal, the input enable signal is input into buffer circuit 704, enabling the operation of buffer circuit 704. An input signal is also input into buffer circuit 704, which buffers the input signal and outputs an output signal when enabled. Output buffer circuit 700 also includes resistors 706 and 708 which, when toggled, allow the output voltage to have a weak pull-up or pull-down when not in use, to avoid floating voltages. In accordance with some embodiments of the present invention, output buffer cell 700 may be a tristate buffer with the input enable signal being used as the tristate control.

FIG. 7B shows a logical view of bidirectional control signal cell 508, consistent with the present invention. Bidirectional control signal cell 508 utilizes a switch 710 enabled by a toggle to control the flow of a signal through the cell.

FIG. 7C shows a logical view of input buffer cell 510, consistent with the present invention. As shown in FIG. 7C, input buffer cell 510 includes a buffer circuit 712 to buffer an input signal.

As noted above, both programmable logic block 202 and programmable logic interface 204 include programmable logic routing cells. Programmable logic routing cells include double multiplexing cell 304, quad multiplexing cell 302, input multiplexer cell 306, output multiplexer cell 310, double/quad multiplexing cell 502, wraparound multiplexer cell 514 and double/quad driving cell 512. Consistent with some embodiments of the present invention, these programmable logic routing cells may be implemented using a consistent area-optimized approach. The programmable logic routing cells may be invisible to a user or designer and are allocated and configured automatically by design software. The routing architecture within programmable logic array 102 allows for push button routability such that routing resources may be allocated and optimized using software place and route algorithms that do not require manual intervention. The routing architecture also allows for scalable routing such that the routing structure may be scalable for larger programmable logic arrays. The routing architecture including the above-noted programmable logic routing cells provides routability to and from programmable logic blocks 202 to allow programmable logic array 102 to be inserted as a hard macro in field programmable ASIC 100. Moreover, the programmable logic routing cells allow columns of programmable logic blocks 202 in programmable logic array 102 to be removed as a hard macro such that other hard macro structures such as memories and multipliers can be inserted into programmable logic array 102, allowing for field programmable ASIC 100 utilizing programmable logic array 102 to be optimized for a specific application.

Figure 8:
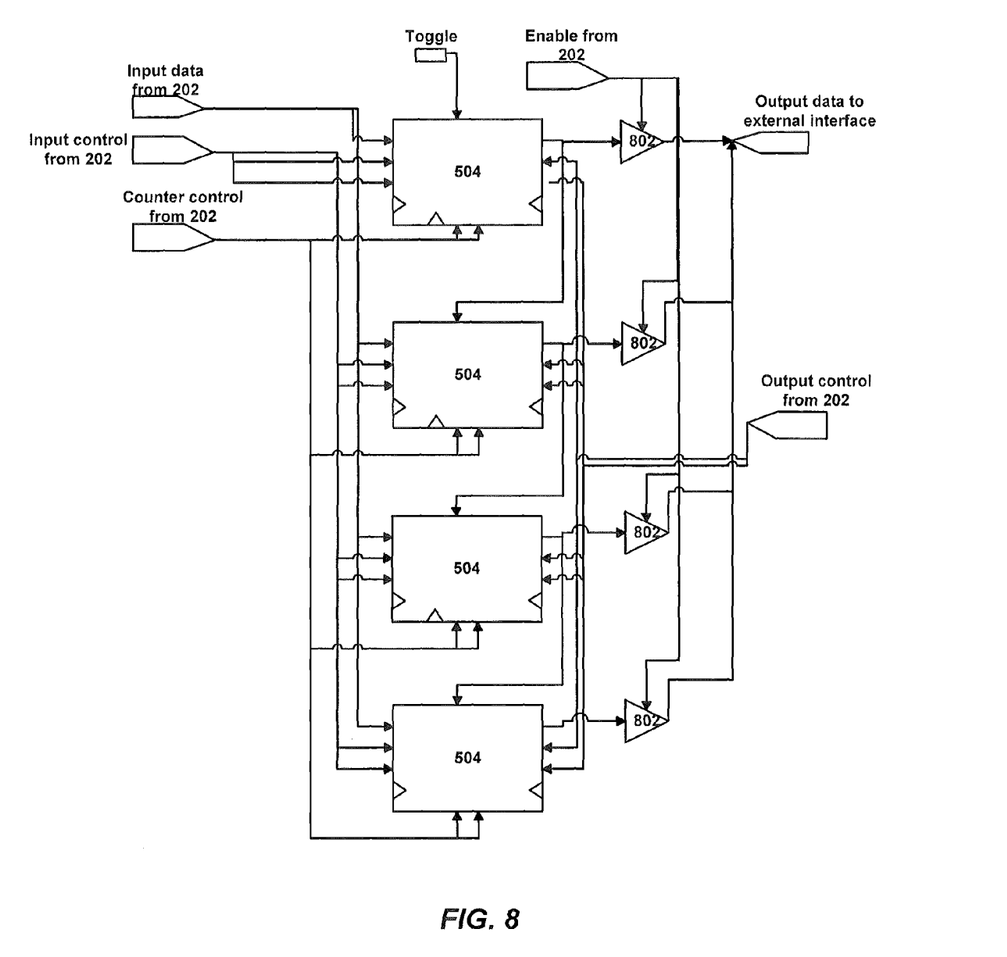
FIG. 8 is a diagram illustrating the dataflow between a programmable logic block and an external interface of field programmable ASIC through a programmable logic interface, consistent with the present invention.

FIG. 8 is a diagram illustrating the dataflow between programmable logic block 202 and an external interface of field programmable ASIC 100 through programmable logic interface 204. As shown in FIG. 8, a plurality of logic block input cells 504 receive data input from programmable logic block 202, an input control signal from programmable logic block 202, a counter control signal from programmable logic block 202, and a toggle signal. Logic block input cells 504 also receive an output control signal from programmable logic block 202, which provides instructions to logic block input cells 504 which control logic block input cells 504 and how logic block input cells 504 handle the input data. Based on the output control signal, logic block input cells 504 may perform register operations, logic operations, or other similar operations as discussed above, which facilitate the communication of programmable logic block 202 with an external interface of field programmable ASIC 100. When toggled, logic block input cells 504 output a signal which is buffered in buffer 802, and then output to external interface upon receiving an enable signal from programmable logic block 202.

Figure 9:
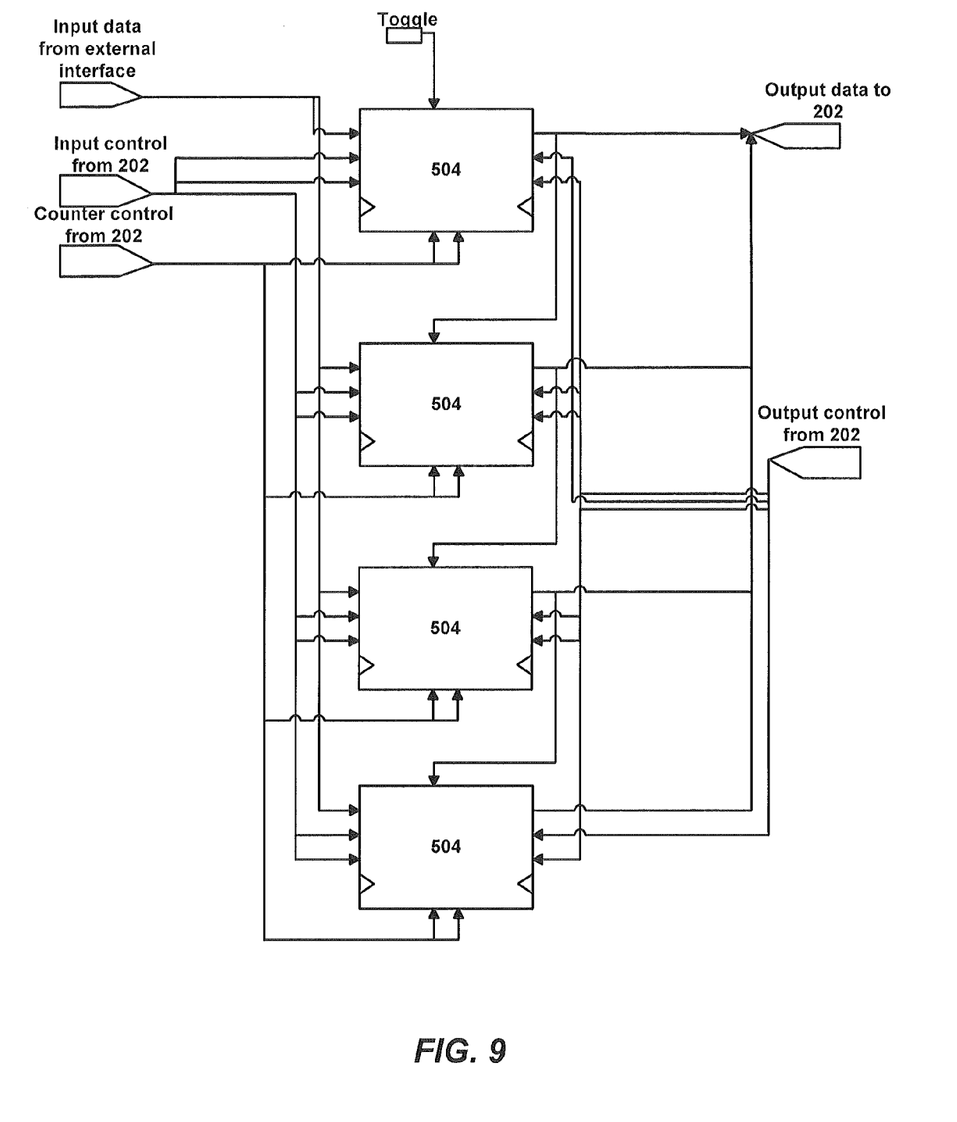
FIG. 9 is a diagram illustrating the dataflow between an external interface of field programmable ASIC and a programmable logic block through a programmable logic interface, consistent with the present invention.

FIG. 9 is a diagram illustrating the dataflow between an external interface of field programmable ASIC 100 and programmable logic block 202 through programmable logic interface 204. As shown in FIG. 9, a plurality of logic block input cells 504 receive data input from external interface of field programmable ASIC 100, an input control signal from programmable logic block 202, a counter control signal from programmable logic block 202, and a toggle signal. Logic block input cells 504 also receive an output control signal from programmable logic block 202, which provides instructions to logic block input cells 504 which control logic block input cells 504 and how logic block input cells 504 handle the input data. Based on the output control signal, logic block input cells 504 may perform register operations, logic operations, or other similar operations as discussed above, which facilitate the communication of external interface of field programmable ASIC 100 with programmable logic block 202. When toggled, logic block input cells 504 output a signal which is output to programmable logic block 202.

Figure 10A:
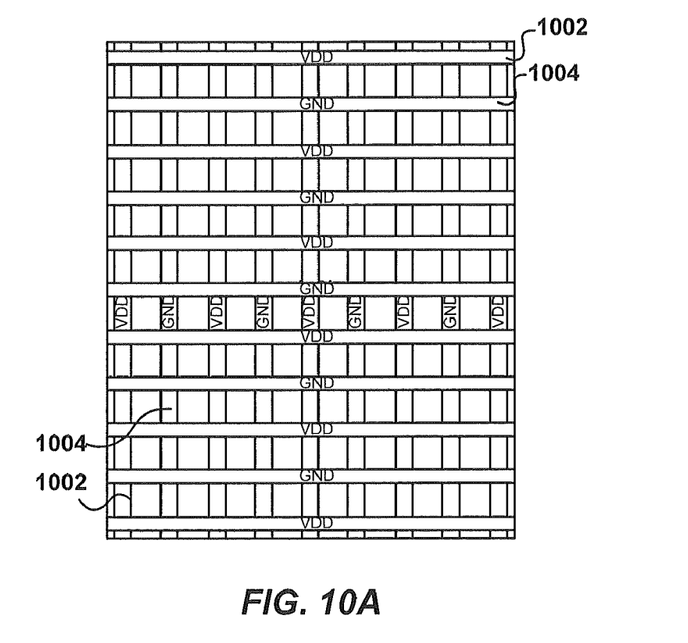
FIGS. 10A and 10B illustrate power grids for providing power to a programmable logic array, consistent with the present invention.
Figure 10B:
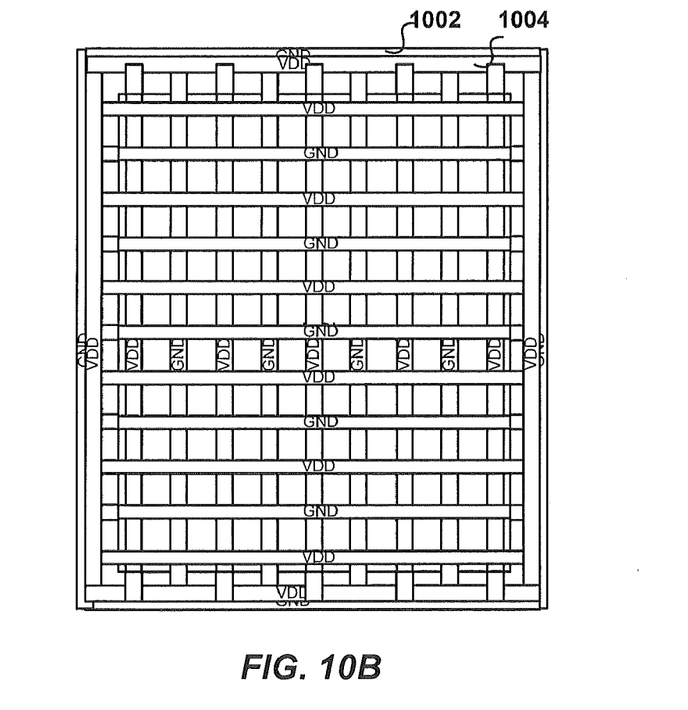

FIGS. 10A and 10B illustrate power grids for providing power to programmable logic array 102, consistent with the present invention. FIG. 10A illustrates a power grid having alternating supply voltage (VDD) 1002 and ground (GND) 1004 power rails. In accordance with some embodiments of the present invention, VDD 1002 and GND 1004 power rails may be spaced apart by about 10 to 30 microns. VDD 1002 and GND 1004 power rails may also take other shapes than a grid depending on a mounting scheme of field programmable ASIC 100. For example, a grid structure may be preferred if the ASIC uses flip chip mounting, while a power ring surrounding programmable logic array 102, as is shown in FIG. 10B, may be more preferable if a wire-bond mounting scheme is used. In addition, a width of VDD 1002 or GND 1004 power rail may be chosen depending on the product requirements of field programmable ASIC 100.

Figure 11:
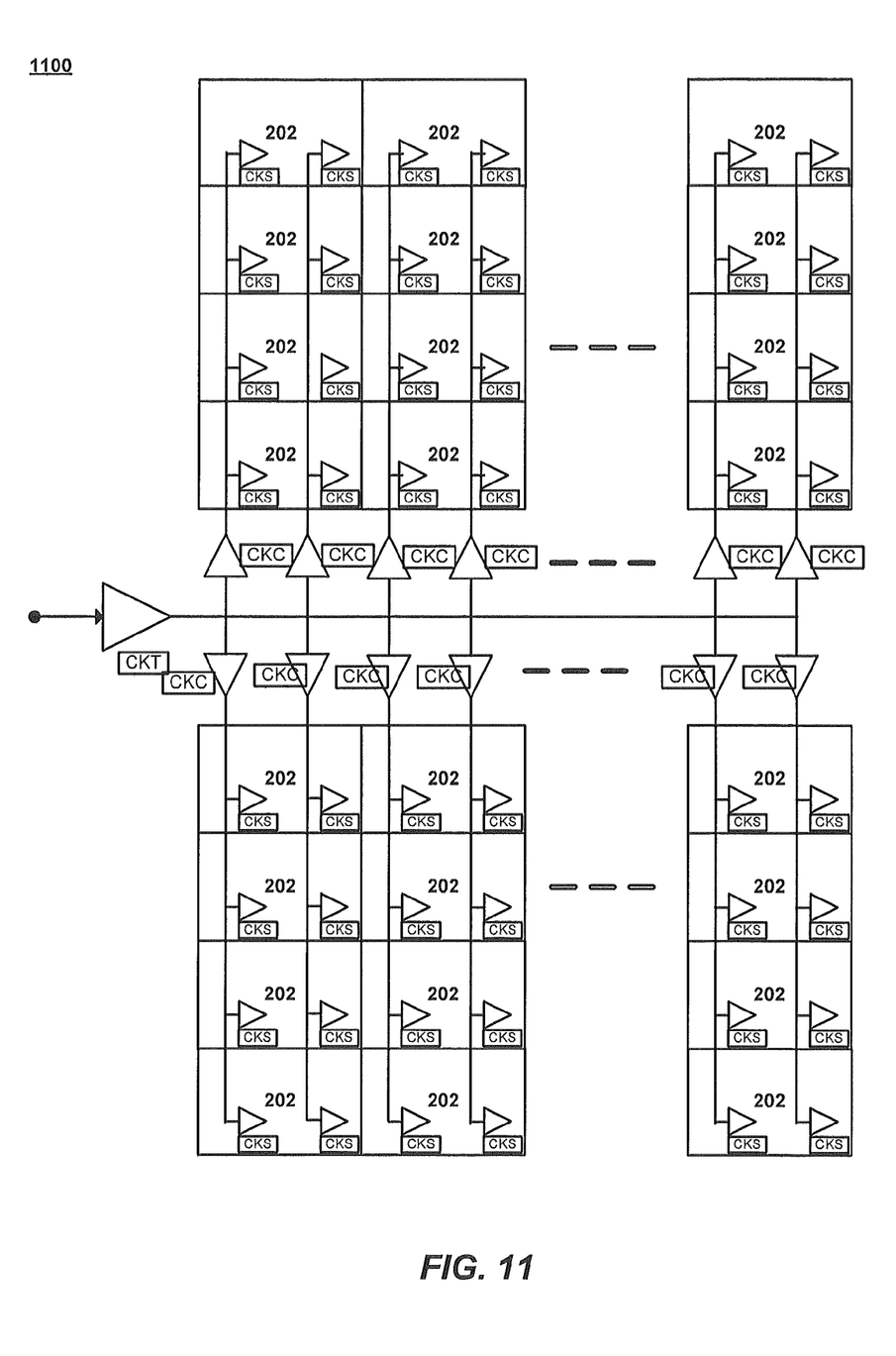
FIG. 11 is a diagram showing a clock tile circuit, consistent with the present invention.

FIG. 11 is a diagram showing clock tile circuit 1100, consistent with the present invention. As shown in FIG. 11, clock tile circuit 1100 includes a network of programmable logic block clock multiplexers CKS which are input into programmable logic blocks 202 in programmable logic array 102. Although FIG. 11 shows an example wherein two programmable logic block clock multiplexers CKS are provided in each programmable logic block, more or less may be provided depending on the specific application of field programmable ASIC 100. As also shown in FIG. 11, clock tile circuit 1100 also includes a clock tile circuit multiplexer CKT which receives global clock signal inputs from field programmable ASIC and logic inputs from adjacent programmable logic blocks 202, and outputs clock signals to clock column multiplexers CKC. Clock column multiplexers CKC receive the clock signals from clock tile circuit multiplexer CKT and logic inputs from adjacent programmable logic blocks, and outputs clock signals to logic block clock multiplexers CKS. In accordance with some aspects of the present invention, clock column multiplexer CKC and/or logic block clock multiplexer CKS may be configured by programmable logic array 102 to gate all clock activity within the programmable logic blocks 202 which it provides a clock signal to. Moreover, the skew of clock tile circuit 1100 may be the sum of wire delays on the columns driven by clock tile circuit multiplexer CKT and clock column multiplexer CKC.

In accordance with aspects of the present invention, clock tile circuit 1100 may implement a plurality of clocking schemes. For example, clocking schemes may allow for low skew clock distribution throughout programmable logic array 102. Clocking schemes consistent with the present invention also allow for the distribution of eight or more global clocks throughout programmable logic array 102. Moreover, when designing programmable logic array 102, clock resources not in use are taken into account by design software, and clock gating is automatically generated by the design software so that regions of programmable logic array not in use do not have transitions on the clock. Furthermore, the design software may also optimize placement of primitives or cells in order to minimize clock power.

Consistent with the present invention, verification procedures may be performed on designed programmable logic arrays 102 to ensure that logic and routing of the designed programmable logic array 102 will allow the programmable logic array 102 to operate in the manner designed. In addition, such verification procedures may also facilitate the verification of the proper operation of programmable logic array 102 within field programmable ASIC 100. Verification procedures may include hardware verification, software verification stored on a computer-readable medium, and end-to-end verification, which uses both hardware and software verification, to ensure that the final output matches the initial design in function.

In accordance with some embodiments of the present invention, silicon test procedures may also be performed on a designed programmable logic array 102 to ensure proper operation and function of the designed array. Such silicon testing procedures may include built-in self-testing (BIST) procedures and boundary scan procedures. BIST procedures may include separate BIST procedures for configuration memory interface, programmable logic blocks 202, and programmable logic interface 204. Boundary scan procedures may be provided in logic embedded in programmable logic array 102, and also may provide functionality that can be used to implement the IEEE 1149 JTAG boundary scan standard.

Figure 12:
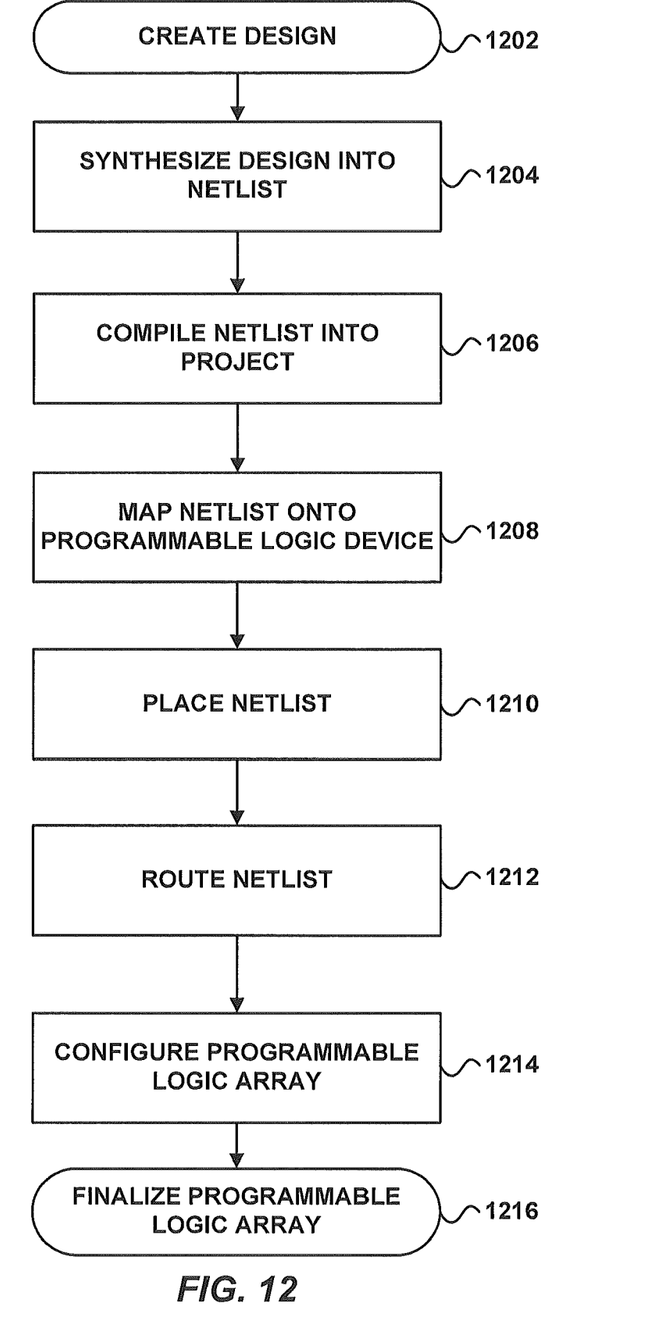
FIG. 12 is a flowchart showing a method of designing a programmable logic array, consistent with the present invention.

In accordance with some embodiments of the present invention, computer-executable instructions for performing a method for designing programmable logic array 102 for implementation field programmable ASIC 100 may be stored on a computer-readable medium. FIG. 12 is a flowchart showing a method of designing programmable logic array 102, consistent with the present invention. As shown in FIG. 12, a design for programmable logic array 102 (step 1202) is first created. The design may be created using standard HDL descriptors such as Verilog or VHDL, and is created on, or input into, a computer or other electronic device executing the instructions for designing programmable logic array 102. The design is then synthesized into a netlist (step 1204). The netlist is a circuit description of the interconnected primitives or cells as they will appear in the designed programmable logic array 102. Using the netlist, the design will be compiled into a project (step 1206). Compiling may include reading the netlist, translating the netlist into vendor-specific cell or primitive libraries or translating the netlist between different descriptor languages, if needed. The compiled project is then mapped onto a blank programmable logic array device (step 1208). Mapping may include mapping out the location of cells or primitives from the synthesized netlist onto a programmable logic array device, on which programmable logic array 102 will be produced. Mapping may further include mapping logic cells 308 to create specific types of look-up tables to achieve the desired functionality of the designed programmable logic array 102.

Following the mapping step, the mapped netlist is placed onto a blank programmable logic array (step 1210). The placed netlist is then routed on the blank programmable logic array (step 1212). The routed netlist is then configured to operate as designed (step 1214). Configuration step 1214 may include creating values of the configuration memory interface with appropriate address and data values. Configuration step 1214 may also include configuring programmable logic array 102 to operate as intended within field programmable ASIC 100, thus enabling programmable logic array 102 to be inserted within field programmable ASIC as a hard macro block. Finally, programmable logic array 102 is finalized and produced, and/or inserted into field programmable ASIC 100 (step 1216).

In accordance with some embodiments of the present invention, the finalized programmable logic array 102 is capable of being further programmed and modified after production using appropriate software and programming languages. Moreover, because programmable logic array 102 can be inserted into field programmable ASIC 100 as a hard macro block, an application-specific silicon solution may be designed which provides the speed and cost efficiency of an ASIC or ASSP, but with the flexibility and modification capabilities of a programmable logic array.

For illustrative purposes, embodiments of the invention have been specifically described above. This disclosure is not intended to be limiting. Therefore, the invention is limited only by the following claims.

What is claimed is:

1. A programmable logic array for use in an field programmable application specific integrated circuit (ASIC), comprising:
   programmable logic blocks;
   programmable logic interfaces, the programmable logic interfaces coupling the programmable logic blocks to external interfaces of the field programmable ASIC, and enabling the programmable logic array to be inserted into the field programmable ASIC as a hard macro block,
   wherein:
   the programmable logic blocks comprise a plurality of programmable logic block cells capable of being programmed to perform specific functions;
   the programmable logic interfaces comprise a plurality of programmable logic interface cells capable of being programmed to perform specific functions; and
   the programmable logic block cells and the programmable logic interface cells are scalable for providing a scalable architecture and implementation for the programmable logic array; and
   the programmable logic interface cells further comprising programmable interface blocks and programmable interface routing blocks.

2. The programmable logic array according to claim 1, wherein the programmable logic blocks and programmable logic interfaces are programmable after manufacture.

3. The programmable logic array according to claim 1, wherein the plurality of programmable logic block cells comprise:
   logic cells, the logic cells used to implement look-up table functionality, arithmetic, multiplexer and reduction operators on the programmable logic array; and
   programmable block routing cells, the programmable block routing cells providing input multiplexing, output multiplexing, and line crossovers.

4. The programmable logic array according to claim 1, further comprising a configuration memory interface, the configuration memory interface being a static random access memory (SRAM)-based interface, and storing instructions for programming the programmable logic array.

5. The programmable logic array according to claim 1, further comprising a power grid, the power grid comprising a mesh of alternating power rails of ground and power supply voltage.

6. A programmable logic array for use in an field programmable application specific integrated circuit (ASIC), comprising:
   programmable logic blocks;
   programmable logic interfaces, the programmable logic interfaces coupling the programmable logic blocks to external interfaces of the field programmable ASIC, and enabling the programmable logic array to be inserted into the field programmable ASIC as a hard macro block;
   the programmable logic blocks comprising a plurality of programmable logic block cells capable of being programmed to perform specific functions;
   the programmable logic interfaces comprise a plurality of programmable logic interface cells capable of being programmed to perform specific functions;
   the programmable logic block cells and the programmable logic interface cells are scalable for providing a scalable architecture and implementation for the programmable logic array,
   wherein the plurality of programmable logic block cells comprise logic cells, the logic cells used to implement look-up table functionality, arithmetic, multiplexer and reduction operators on the programmable logic array; and
   programmable block routing cells, the programmable block routing cells providing input multiplexing, output multiplexing, and line crossovers,
   wherein the programmable block routing cells comprise:
      at least one double line multiplexer cell, the double line multiplexer cell providing coupling over two logic cells;
      at least one quad line multiplexer cell, the quad line multiplexer cell providing coupling over four logic cells;
      at least one input line multiplexer cell; and
      at least one output line multiplexer cell.

7. The programmable logic array according to claim 6, wherein the plurality of logic interface cells comprise programmable interface blocks and programmable interface routing blocks.

8. The programmable logic array according to claim 7, wherein the plurality of programmable logic interface cells comprise:
   at least one logic block input cell, the logic block input cell being programmable to register signals input into the programmable logic array, serialize or de-serialize inputs and outputs to allow the programmable logic array and the ASIC implementation to use separate clocks, and synchronize data input to and output from the programmable logic array;
   at least one input buffer cell;
   at least one output buffer cell; and
   at least one bidirectional connection cell; and
   the programmable interface routing cells comprise:
   at least one double/quad multiplexing cell;
   at least one wraparound multiplexer cell; and
   at least one double/quad driving cell.

9. The programmable logic array according to claim 1, wherein:
   a programmable logic design program is stored on computer-readable medium for execution on a computer remote from the programmable logic array, the design program comprising:
      computer-executable instructions for allowing a user to design a layout of the programmable logic block cells and programmable logic interface cells to form the programmable logic array;
      computer-executable instructions for allowing the user to program the programmable logic block cells and the programmable logic interface cells;
      computer-executable instructions for placing and routing the user-created design to connect the programmable logic block cells to the field programmable ASIC and the programmable logic interface cells; and
      computer-executable instructions for configuring the programmable logic array for operation and to be inserted into the field programmable ASIC as a hard macro block.

10. The programmable logic array according to claim 9, wherein the programmable logic design program further comprises computer-executable instructions for validating and testing the programmable logic array.

11. The programmable logic array according to claim 10, wherein the computer-executable instructions for validating and testing the programmable logic array comprise instructions for performing hardware and software verification, silicon tests, and boundary scan tests.

12. A computer-readable medium containing computer-executable instructions for performing a method for designing a programmable logic array and implementing the programmable logic array in an application specific integrated circuit (ASIC) to produce a field programmable ASIC, the method comprising:
   designing the programmable logic array using a plurality of programmable logic blocks, programmable logic interfaces, wherein the programmable logic blocks comprise a plurality of programmable logic block cells capable of being programmed to perform specific functions, and the programmable logic interfaces comprise a plurality of programmable logic interface cells capable of being programmed to perform specific functions;
   mapping the designed programmable logic array onto a blank programmable logic device;
   placing the mapped designed programmable logic array onto the blank programmable logic device;
   routing the placed designed programmable logic array on the blank programmable logic device;
   configuring the programmable logic device to operate as designed and to be inserted into the ASIC as a hard macro block.

13. The programmable logic array according to claim 12, wherein the plurality of programmable logic block cells comprise:
   logic cells, the logic cells used to implement look-up table functionality, arithmetic, multiplexer and reduction operators on the programmable logic array; and
   programmable block routing cells, the programmable block routing cells providing input multiplexing, output multiplexing, and line crossovers.

14. The method of claim 12, further comprising:
   validating and testing the configured programmable logic device, wherein validating and testing the configured programmable logic device comprises:

performing at least one of a hardware verification routine, a software verification routine, a built-in silicon test (BIST), and a boundary scan test.

15. A computer-readable medium containing computer-executable instructions for performing a method for designing a programmable logic array and implementing the programmable logic array in an application specific integrated circuit (ASIC) to produce a field programmable ASIC, the method comprising:

designing the programmable logic array using a plurality of programmable logic blocks and programmable logic interfaces;

mapping the designed programmable logic array onto a blank programmable logic device;

placing the mapped designed programmable logic array onto the blank programmable logic device;

routing the placed designed programmable logic array on the blank programmable logic device;

configuring the programmable logic device to operate as designed and to be inserted into the ASIC as a hard macro block;

wherein the programmable logic blocks comprise a plurality of programmable logic block cells capable of being programmed to perform specific functions, and the programmable logic interfaces comprise a plurality of programmable logic interface cells capable of being programmed to perform specific functions, wherein the plurality of programmable logic block cells comprise:

logic cells, the logic cells used to implement look-up table functionality, arithmetic, multiplexer and reduction operators on the programmable logic array; and programmable block routing cells, the programmable block routing cells providing input multiplexing, output multiplexing, and line crossovers;

wherein the programmable block routing cells comprise:

at least one double line multiplexer cell, the double line multiplexer cell providing coupling over two logic cells;

at least one quad line multiplexer cell, the quad line multiplexer cell providing coupling over four logic cells;

at least one input line multiplexer cell; and at least one output line multiplexer cell.

16. The programmable logic array according to claim 15, wherein the plurality of logic interface cells comprise programmable interface blocks and programmable interface routing blocks.

17. The programmable logic array according to claim 16, wherein the plurality of programmable logic interface blocks comprise:

at least one logic block input cell, the logic block input cell being programmable to register signals input into the programmable logic array, serialize or de-serialize inputs and outputs to allow the programmable logic array and the ASIC implementation to use separate clocks, and synchronize data input to and output from the programmable logic array;

at least one input buffer cell;

at least one output buffer cell; and at least one bidirectional connection cell; and the programmable interface routing cells comprise:

at least one double/quad multiplexing cell;

at least one wraparound multiplexer cell; and at least one double/quad driving cell.

* * * * *